United States Patent
Wu et al.

(10) Patent No.: US 12,411,189 B2
(45) Date of Patent: Sep. 9, 2025

(54) OPTICAL MEASURING DEVICE AND METHOD FOR PLASMA MAGNETIC FIELD WITH ADJUSTABLE SENSITIVITY

(71) Applicant: XI'AN JIAOTONG UNIVERSITY, Xi'an (CN)

(72) Inventors: Jian Wu, Xi'an (CN); Zhiyuan Jiang, Xi'an (CN); Ziwei Chen, Xi'an (CN); Zhenyu Wang, Xi'an (CN); Wei Wang, Xi'an (CN); Xinmiao Zhou, Xi'an (CN); Huantong Shi, Xi'an (CN); Xingwen Li, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 197 days.

(21) Appl. No.: 18/505,162

(22) Filed: Nov. 9, 2023

(65) Prior Publication Data
US 2024/0077549 A1 Mar. 7, 2024

Related U.S. Application Data

(63) Continuation of application No. PCT/CN2022/099531, filed on Jun. 17, 2022.

(30) Foreign Application Priority Data

Apr. 1, 2022 (CN) .......................... 202210339809.1

(51) Int. Cl.
*G01R 33/032* (2006.01)
(52) U.S. Cl.
CPC ................ *G01R 33/0322* (2013.01)
(58) Field of Classification Search
CPC .... G01R 33/0322; G01R 33/032; Y02E 30/10
(Continued)

(56) References Cited

U.S. PATENT DOCUMENTS 3,545,867 A   12/1970  Rostas
4,980,896 A * 12/1990  Forsyth ................. H01S 3/2316
                                                              372/101
(Continued)

FOREIGN PATENT DOCUMENTS

CN          111366881 A       7/2020
CN          112894149 A       6/2021
(Continued)

OTHER PUBLICATIONS

International Search Report (PCT/CN2022/099531); Date of Mailing: Dec. 27, 2022.
(Continued)

*Primary Examiner* — Christopher P Mcandrew
(74) *Attorney, Agent, or Firm* — Wiersch Law Group

(57) ABSTRACT

The present disclosure discloses an optical measurement device and method for a plasma magnetic field with adjustable sensitivity. The method comprises the following steps: constructing an optical rotation measurement system based on a pulsed laser beam for measuring an optical rotation image and a shadow image; processing the optical rotation image and the shadow image, and obtaining a distribution of proportional coefficients based on a light intensity distribution; obtaining a distribution of rotation angles based on a mapping relationship between the proportional coefficients and the rotation angles; constructing an interference measurement system based on the pulsed laser beam, and measuring a phase shift of an interference image; calculating a distribution of electron areal densities based on the phase shift in the interference image; obtaining a two-dimensional distribution of an average magnetic field based on the rotation angles and the electron areal densities.

10 Claims, 2 Drawing Sheets

(58) Field of Classification Search
USPC ...................................................... 324/244.1
See application file for complete search history.

(56) References Cited

U.S. PATENT DOCUMENTS

| | | | |
|---|---|---|---|
| 2006/0065820 A1* | 3/2006 | Nagai | G01R 33/032 |
| | | | 250/225 |
| 2017/0330636 A1* | 11/2017 | Sekine | G21B 1/23 |
| 2018/0348165 A1* | 12/2018 | Nakamura | G02B 21/0092 |
| 2019/0235031 A1* | 8/2019 | Ibrahim | G01R 33/24 |
| 2019/0304611 A1* | 10/2019 | Cho | G21B 1/057 |
| 2022/0082639 A1* | 3/2022 | Kim | G01R 33/26 |

FOREIGN PATENT DOCUMENTS

| | | |
|---|---|---|
| CN | 114252816 A | 3/2022 |
| JP | H07333256 A | 12/1995 |
| JP | H09281441 A | 10/1997 |
| JP | 2000131351 A | 5/2000 |

OTHER PUBLICATIONS

Notice of Allowance(CN202210339809.1); Date of Mailing: Apr. 13, 2023.

* cited by examiner

OPTICAL MEASURING DEVICE AND METHOD FOR PLASMA MAGNETIC FIELD WITH ADJUSTABLE SENSITIVITY

CROSS-REFERENCE TO RELATED APPLICATIONS

The present application is a continuation of International Application No. PCT/CN2022/099531, filed on Jun. 17, 2022, which claims priority to Chinese Application No. 202210339809.1, filed on Apr. 1, 2022, the contents of both of which are incorporated herein by reference in their entireties.

TECHNICAL FIELD

The present disclosure belongs to the technical field of magnetic field measurement, and relates to an optical measurement device and method for a plasma magnetic field with adjustable sensitivity.

BACKGROUND

Magnetic field measurement technology is mostly used to solve important scientific research and physical problems, and is widely used in astronomy, resource exploration, scientific research and other fields. The measurement of a magnetic field in vacuum is mainly carried out by a contact magnetic induction coil. The magnetic induction coil has the characteristics of simple principle, low cost and easy operation, and thus has been widely used in the measurement of time-varying magnetic fields. The main body of the magnetic induction coil is one or more small coils. After integrating the induced electromotive force in the coil with time, the magnetic field distribution at the position of the magnetic induction coil can be obtained. However, the probe of a magnetic probe directly going into the plasma has the following influences: firstly, it cools the plasma and disturbs the movement process; and secondly, the induced current generated by itself will interfere with the magnetic field of the plasma. At the same time, when the temperature outside is too high, the coating con the magnetic probe will be ablated, and the measurement signal may suddenly exceed the measurable threshold, thereby damaging the measuring probe.

Another non-contact measurement method is Faraday rotation, which is suitable for plasmas in vacuum. When a beam of linearly polarized light passes through a plasma, it will deflect, and the rotation angle is related to the electron density and magnetic field distribution on the light propagation path. However, this method needs to know the electron densities of all positions in the optical path, which has a high requirement for the environment of the plasma. In the process of measuring the plasma, the error is large. How to improve the sensitivity of the plasma in magnetic field is an urgent problem to be solved.

SUMMARY

The present disclosure aims to solve the problems in the prior art by providing an optical measuring device and method for a plasma magnetic field with adjustable sensitivity, which can improve the sensitivity of the plasma in the magnetic field.

In order to achieve the above object, the present disclosure adopts the following technical solution:

Firstly, the present disclosure provides an optical measuring device for a plasma magnetic field with adjustable sensitivity, which includes a pulsed laser, a pulsed laser beam, a polarizer, a first beam splitter, a plasma, a second beam splitter, a third beam splitter, a fourth beam splitter, a first mirror, a second mirror, a fifth beam splitter, a first polarization analyzer, a second polarization analyzer, a first camera, a second camera, a third camera and a fourth camera.

The pulsed laser is used as a light source for emitting the pulsed laser beam, and the pulsed laser beam emitted by the pulsed laser passes through the plasma via the polarizer and then enters the third beam splitter for beam splitting; the pulsed laser beam reflected by the third beam splitter passes through the first polarization analyzer and enters the second camera; the pulsed laser beam transmitted by the third beam splitter enters the fourth beam splitter for beam splitting; the pulsed laser beam reflected by the fourth beam splitter passes through the second polarization analyzer and enters the third camera; the pulsed laser beam transmitted by the fourth beam splitter enters the fourth camera via the first mirror.

The pulsed laser beam emitted by the pulsed laser and passes through the first beam splitter via the polarizer for beam splitting; the pulsed laser beam transmitted by the first beam splitter passes through the plasma and the second beam splitter in turn, and the pulsed laser beam reflected by the second beam splitter enters the fifth beam splitter; the pulsed laser beam reflected by the first beam splitter passes through the second mirror and enters the fifth beam splitter, and two beams entering the fifth beam splitter enter the first camera together.

Secondly, the present disclosure provides an optical measurement method for a plasma magnetic field with adjustable sensitivity, including the following steps:

constructing an optical rotation measuring system based on a pulsed laser beam for measuring an optical rotation image and a shadow image;

processing the optical rotation image and the shadow image, and obtaining a distribution of proportional coefficients based on a light intensity distribution;

obtaining a distribution of rotation angles by combining a mapping relationship between the proportional coefficients and the rotation angles;

constructing an interference measurement system based on the pulsed laser beam, and measuring a phase shift of an interference image;

calculating a distribution of electron areal densities based on the phase shift in the interference image; and obtaining a two-dimensional distribution of an average magnetic field based on the rotation angles and the electron areal densities.

Compared with the prior technology, the present disclosure has the following beneficial effects:

According to the present disclosure, by providing a polarizer, a third beam splitter, a fourth beam splitter, a first mirror, a first polarization analyzer, a second polarization analyzer, a second camera, a third camera and a fourth camera, optical rotation images and shadow images can be obtained, and the distribution of rotation angles can be determined by measuring the intensity changes of the optical rotation images and the shadow images. Meanwhile, a first beam splitter, a second beam splitter, a fifth beam splitter, a second mirror and a first beam splitter are also provided, interference images can be obtained, the distribution of the electron densities can be measured through the interference images, and the magnetic field intensity of the space where the plasma is located can be finally determined. The spatial range of a measurable magnetic field depends on the size of a probe spot, and by adjusting the splitting ratio of the third beam splitter and the fourth beam splitter in the optical rotation channel, the sensitivity of optical rotation measurement can be adjusted, so as to realize efficient, reliable and adjustable sensitivity measurement of magnetic induction intensity.

Reference signs: 1—Pulsed laser; 2—Pulsed laser beam; 3—Polarizer; 4—First beam splitter; 5—Plasma; 6—Second beam splitter; 7—Third beam splitter; 8—Fourth beam splitter; 9—First mirror; 10—Second mirror; 11—Fifth beam splitter; 12—First polarization analyzer; 13—Second polarization analyzer; 14—First camera; 15—Second camera; 16—Third camera; 17—Fourth camera; 18—Vacuum chamber.

DESCRIPTION OF EMBODIMENTS

The present disclosure will be described in further detail with reference to the accompanying drawings:

The theoretical basis of the present disclosure is that Faraday rotation effect is a phenomenon that when a beam of plane polarized light passes through a magneto-optical medium placed in a magnetic field, the polarization plane of the plane polarized light will rotate with the magnetic field parallel to the light direction. When the plasma to be measured is used as a magneto-optical medium, a beam of linearly polarized light propagating through the medium can be understood as the superposition of two beams of circularly polarized light with opposite optical rotation directions. Due to the magneto-optical effect, these two beams of light have different refractive indexes and propagation velocities, and they have different phase lags after passing the same distance, which makes the linearly polarized light passing through the plasma produce a certain rotation angle. When a pulsed laser beam with a fixed wavelength is used for Faraday optical rotation diagnosis, the Faraday optical rotation angle is:

$$\alpha_{[rad]} = 2.62 \cdot 10^{-17} \lambda_{[cm]}^2 \int_0^L n_{e[cm^{-3}]} B_{[G]} \cdot dl_{[cm]}$$

where $\lambda$ is the wavelength of a pulsed laser beam, $n_e$ is the electron density, B is a component of a magnetic field vector on the pulsed laser beam, and dl is an element of the incident optical path.

For Faraday optical rotation, the present disclosure uses an polarization analyzer with a high extinction ratio to measure the optical rotation angle, and calculates the change of plasma polarization angle through the change of the light intensity in two optical rotation channels and one shadow channel. The high extinction ratio means that the extinction ratio is greater than 100000:1.

Figure 1:
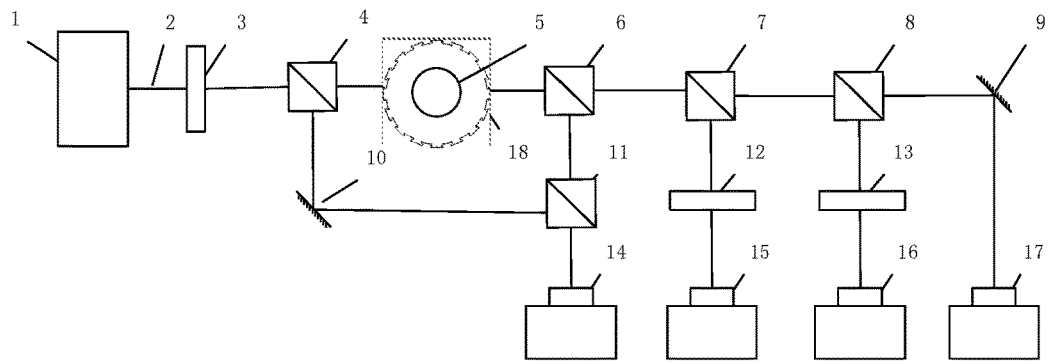
FIG. 1 is a structural diagram of an optical measuring device for a plasma magnetic field with adjustable sensitivity according to an embodiment of the present disclosure.

Referring to FIG. 1, the present disclosure discloses an optical measuring device for a plasma magnetic field with adjustable sensitivity, which includes a pulsed laser 1, a pulsed laser beam 2, a polarizer 3, a first beam splitter 4, a plasma 5, a second beam splitter 6, a third beam splitter 7, a fourth beam splitter 8, a first mirror 9, a second mirror 10, a fifth beam splitter 11, a first polarization analyzer 12, a second polarization analyzer 13, a first camera 14, a second camera 15, a third camera 16 and a fourth camera 17.

The pulsed laser 1 is used as a light source for emitting the pulsed laser beam 2, and the pulsed laser beam 2 emitted by the pulsed laser 1 passes through the plasma 5 via the polarizer 3 and then enters the third beam splitter 7 for beam splitting; the pulsed laser beam 2 reflected by the third beam splitter 7 passes through the first polarization analyzer 12 and enters the second camera 15; the pulsed laser beam 2 transmitted by the third beam splitter 7 enters the fourth beam splitter 8 for beam splitting; the pulsed laser beam 2 reflected by the fourth beam splitter 8 passes through the second polarization analyzer 13 and enters the third camera 16; the pulsed laser beam 2 transmitted by the fourth beam splitter 8 enters the fourth camera 17 via the first mirror 9.

The pulsed laser beam 2 emitted by the pulsed laser 1 and passes through the first beam splitter 4 via the polarizer 3 for beam splitting; the pulsed laser beam 2 transmitted by the first beam splitter 4 passes through the plasma 5 and the second beam splitter 6 in turn, and the pulsed laser beam 2 reflected by the second beam splitter 6 enters the fifth beam splitter 11; the pulsed laser beam 2 reflected by the first beam splitter 4 passes through the second mirror 10 and enters the fifth beam splitter 11, and two beams entering the fifth beam splitter 11 enter the first camera 14 together.

The plasma 5 is arranged inside the vacuum chamber 18. The vacuum chamber 18 is sealed by a steel plate and pumped to vacuum by a vacuum pump; the plasma 5 is generated by the pulse current applied by a wire array load, with a pulse current peak value of 450 kA and a rising edge of 400 ns; the pulse width has a magnitude of ns or less, which ensures the time resolution of measurement.

The centers of the first beam splitter 4, the second beam splitter 6, the third beam splitter 7 and the fourth beam splitter 8 are at the same height.

The polarizer 3, the first polarization analyzer 12 and the second polarization analyzer 13 are polarizers with an extinction ratio greater than 100,000:1, thus improving the accuracy of optical rotation measurement.

The first camera 14, the second camera 15, the third camera 16 and the fourth camera 17 have a linearity of 1, thus ensuring the accuracy of optical rotation image measurement.

The first polarization analyzer 12 and the second polarization analyzer 13 have polarization directions with a same polarization angle with respect to the polarizer 3 but opposite in directions, thereby improving the sensitivity of optical rotation measurement.

Figure 2:
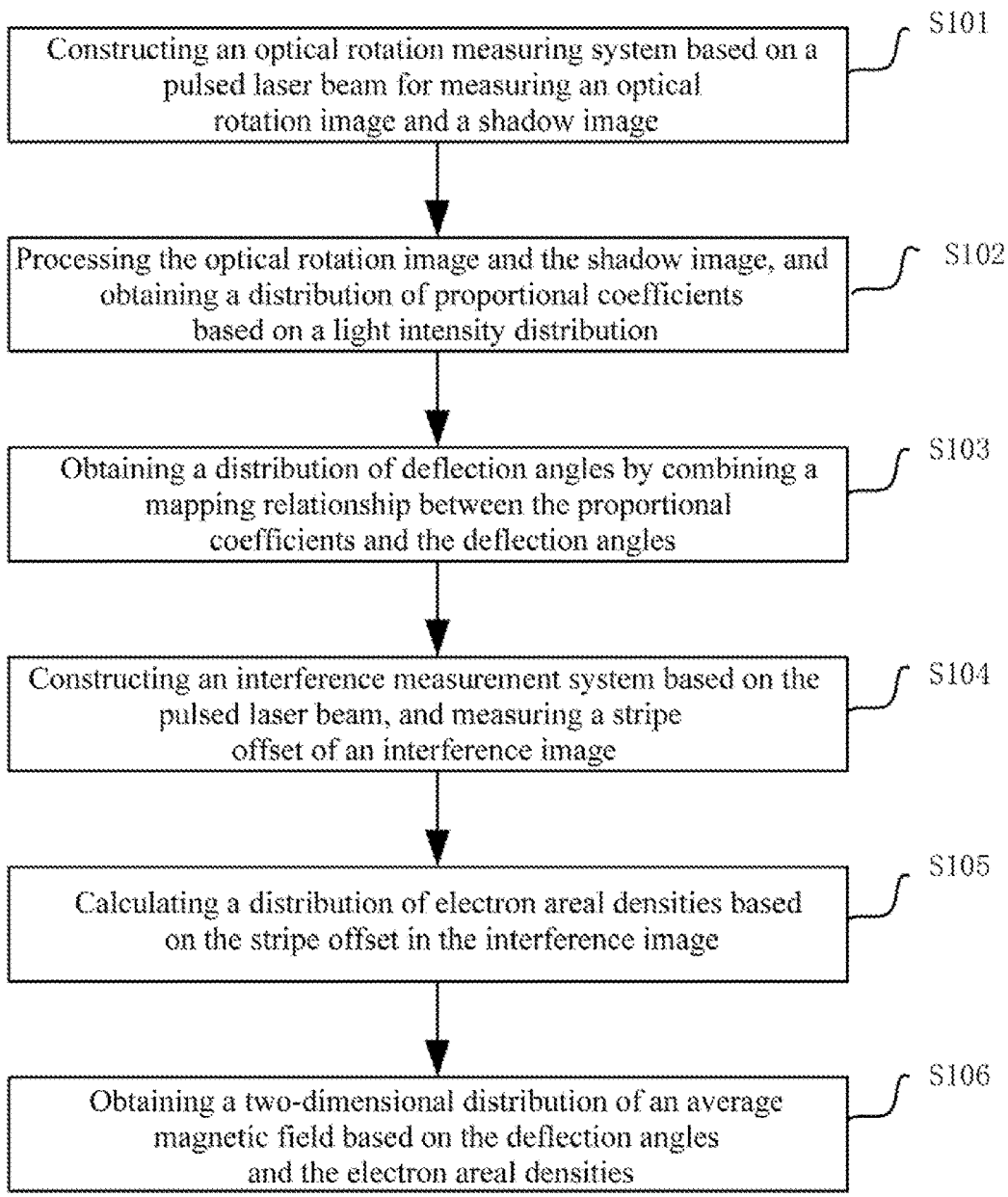
FIG. 2 is a flowchart of an optical measurement method for a plasma magnetic field with adjustable sensitivity according to an embodiment of the present disclosure.

Referring to FIG. 2, the present disclosure discloses an optical measurement method for a plasma magnetic field with adjustable sensitivity. The method includes the following steps:

In this embodiment, the optical rotation medium and space magnetic field are provided by using the pulse current, and the optical rotation angles and electron areal densities are measured respectively by Faraday optical rotation diagnosis combined with Mach-Zehnder interferometer. The sensitivity of optical rotation measurement is improved by using beam splitters with a high optical ratio in the optical rotation diagnosis system.

S101, an optical rotation measurement system is constructed based on a pulsed laser beam to measure an optical rotation image and a shadow image.

The pulsed laser 1 emitting a pulsed laser beam 2. After passing through a polarizer 3 in a p polarization direction to become linearly polarized light, without passing through a plasma, the pulsed laser beam 2 sequentially enters a third beam splitter 7, a fourth beam splitter 8 and a first mirror 9. A second camera 15 captures a picture $I_1$ of the pulsed laser beam 2 reflected by the third beam splitter 7 through the first polarization analyzer 12; the third camera 16 captures a picture of $I_2$ the pulsed laser beam 2 reflected by the fourth beam splitter 8 through the second polarization analyzer 13, and the fourth camera 17 captures a picture $I_3$ of the pulsed laser beam 2 reflected by the first mirror 9.

The pulsed laser 1 emitting the pulsed laser beam 2. After passing through the polarizer 3 in the p polarization direction to become linearly polarized light, and passes through the plasma 5, the pulsed laser beam 2 sequentially entering the third beam splitter 7, the fourth beam splitter 8 and the first mirror 9. The second camera 15 capturing a picture $I'_1$ of the pulsed laser beam 2 reflected by the third beam splitter 7 through the first polarization analyzer 12; the third camera 16 capturing a picture $I'_2$ of the pulsed laser beam 2 reflected by the fourth beam splitter 8 through the second polarization analyzer 13, and the fourth camera 17 capturing a picture $I'_3$ of the pulsed laser beam 2 reflected by the first mirror 9.

S102, the optical rotation image and the shadow image are processed, and the distribution of the proportional coefficients is obtained based on the light intensity distribution.

Figure 3:
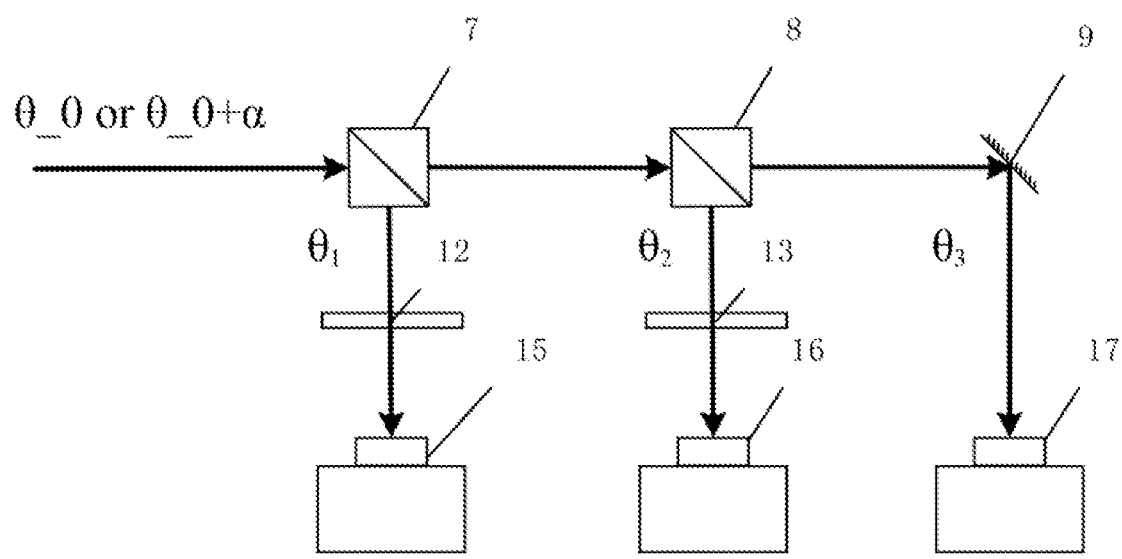
FIG. 3 is a schematic diagram of an optical rotation diagnosis device according to an embodiment of the present disclosure.

Referring to FIG. 3, the polarization state of all light is defined as the included angle between the polarization plane and the p polarization plane. The polarization direction of the incident light is parallel to the polarization direction of P, so the polarization angle of the incident light is 0. The polarization angles of the reflected light of the third beam splitter 7 and the fourth beam splitter 8 are to $\theta_1$ and $\theta_2$, respectively. When the transmission and reflection efficiencies of the third beam splitter 7 and the fourth beam splitter 8 for S polarized light and P polarized light are different, $\theta_1$ and $\theta_2$ are also 0. The fixed angle of the polarization plane of the first polarization analyzer 12 relative to the incident light is $+\beta$, and the fixed angle of the polarization plane of the second polarization analyzer 13 relative to the incident light is $-\beta$. The shadow image is reflected only by the first mirror 9 without an polarization analyzer, and the first mirror has no influence on the polarization direction of the incident light, therefore the polarization angle of the reflected light is also 0. Assuming that the energy distribution of the pulsed laser beam is $I(x,y)$, the intensity of the optical rotation image $I_1$ captured by the second camera 15 is $I_1(x,y)$, and its expression is shown in Formula (1):

$$I_1(x,y)=D_1(0)I(x,y)\cos^2(\beta) \qquad (1)$$

The intensity of the optical rotation image $I_2$ captured by the third camera 16 is $I_2(x,y)$, and its expression is shown in Formula (2):

$$I_2(x,y)=D_2(0)I(x,y)\cos^2(\beta) \qquad (2)$$

The intensity of the shadow image $I_3$ captured by the fourth camera 17 is $I_3(x,y)$, and its expression is shown in Formula (3):

$$I_3(x,y)=D_3(0)I(x,y) \qquad (3)$$

In the formula, $D_1$, $D_2$ and $D_3$ represent the proportional coefficients of the imaging light intensities of the second camera 15, the third camera 16 and the fourth camera 17 relative to the incident light intensity in the imaging system, which are functions of the polarization angles of the incident light.

When the plasma 5 exists, it is assumed that a size of an optical rotation caused by the plasma 5 is $\alpha(x,y)$; when the transmission and reflection efficiencies of the third beam splitter 7 and the fourth beam splitter 8 for S polarized light and P polarized light are different, the polarization angles $\theta_1$ and $\theta_2$ of the reflected light of the third beam splitter 7 and the fourth beam splitter 8 are functions relative to $\alpha(x,y)$; the specific expression is shown in Formula (4):

$$\theta_1 = \cos^{-1}\left(\sqrt{\frac{\cos^2(\alpha)\Box P_r}{\cos^2(\alpha)\Box P_r + \sin^2(\alpha)\Box S_r}}\right) \qquad (4)$$

$$\theta_2 = \cos^{-1}\left(\sqrt{\frac{\cos^2(\alpha)\Box P_t \Box P_r}{\cos^2(\alpha)\Box P_t \Box P_r + \sin^2(\alpha)\Box S_t \Box S_r}}\right)$$

where the S polarized light and the P polarized light are polarized light generated when the pulsed laser beam 2 passes through the polarizer 3; $P_r$ and $P_t$ are the reflection and transmission efficiencies of the third beam splitter 7 and the fourth beam splitter 8 for the P polarized light respectively; $S_r$ and $S_t$ are the reflection and transmission efficiencies of the third beam splitter 7 and the fourth beam splitter 8 for the S polarized light, respectively.

The incident light is the light injected into the plasma 5 after the pulsed laser beam 2 passes through the polarizer.

The reflected light is the light that enters the first polarization analyzer 12 and the second polarization analyzer 13 through the third beam splitter 7 and the fourth beam splitter 8.

Considering the energy fluctuation of the pulsed laser 1, the energy distribution of the pulsed laser beam is set to $I'(x,y)$, then the intensity of the optical rotation image $I'_1$ captured by the second camera 15 is $I'_1(x,y)$, and an expression thereof is shown in Formula (5):

$$I'_1(x,y)=D_1(\alpha)I'(x,y)\cos^2(\theta_1(\alpha)-\beta) \qquad (5)$$

The intensity of the optical rotation image $I'_2$ captured by the third camera 16 is $I'_2(x,y)$, and an expression thereof is shown in Formula (6):

$$I'_2(x,y)=D_2(\alpha)I'(x,y)\cos^2(\theta_2(\alpha)+\beta) \qquad (6)$$

The intensity of the shadow image $I'_3$ captured by the fourth camera 17 is $I'_3(x,y)$, and an expression thereof is shown in Formula (7):

$$I'_3(x,y)=D_3(\alpha)I'(x,y) \qquad (7)$$

A proportional index $I_F$ is introduced, which is shown in Formula (8):

$$I_F(x,y) = \left(\frac{I'_1(x,y)}{I_1(x,y)} - \frac{I'_2(x,y)}{I_2(x,y)}\right) / \frac{I'_3(x,y)}{I_3(x,y)} \qquad (8)$$

S103, a distribution of rotation angles is obtained by combining a mapping relationship between the proportional coefficients and the rotation angles.

When the value of $\beta$ is fixed, there is a mapping relationship between the proportional index $I_F$ and the optical rotation angle α, and a value of the optical rotation angle α is deduced reversely according to the value of the proportional index.

S104, an interference measurement system is constructed based on the pulsed laser beam, and the phase shift of the interference image is measured.

In the present disclosure, a pulsed laser of 532 nm is used to coordinate with Mach-Zehnder interferometer for measurement. The principle is that the incident laser light is divided into load light and reference light. The load light passes through the plasma while the reference light propagates in the air. After passing through an approximate optical path, the two beams converge through a beam splitter and form interference stripes. In the presence of a plasma, due to the change of the refractive index inside the plasma, the optical path of the load light will change, leading to the change of the number of levels of the stripes at the same position, which is reflected the offset of the interference stripes.

The pulsed laser beam 2 emitted by the pulsed laser 1 passes through the first beam splitter 4 through the polarizer 3 for beam splitting; the pulsed laser beam 2 transmitted by the first beam splitter 4 passes through the plasma 5 and the second beam splitter 6 in turn to form load light; the pulsed laser beam 2 reflected by the first beam splitter 4 passes through the second mirror 10 to form reference light; the load light and the reference light entering the fifth beam splitter 11 to form interference stripes, and the first camera 14 captures the interference stripes to obtain interference images; the phase shift δ(y) of the interference images is calculated in a method as shown in Formula (9):

$$\delta(y) = \frac{e^2 \lambda}{4\pi c^2 m_e \varepsilon_0} \int n_e \cdot dl \quad (9)$$

where y is a distance of the pulsed laser beam from an axis of the plasma, e is electron charge, $\varepsilon_0$ is a vacuum dielectric constant, $m_e$ is an electron mass, c is the speed of light.

S105, the distribution of electron areal densities is calculated based on the phase shift in the interference image.

The measurement of the areal electron density in the plasma is shown in Formula (10):

$$\Delta\delta = 4.46 \cdot 10^{-14} \lambda \int_0^L n_e dl \quad (10)$$

where Δδ represents the phase shift; L is a length of a propagation path of the pulsed laser beam in the plasma.

S106, the two-dimensional distribution of an average magnetic field is obtained based on the rotation angles and the electron areal densities.

The two-dimensional distribution of an interference phase shift are acquired by comparing the interference stripes of the load light passing through the plasma 5 with those of the load light not passing through the plasma 5, and an integral distribution of the areal electron density on a pulsed laser beam path is obtained based on the two-dimensional distribution of the interference phase shift.

The average magnetic field intensity $B_a(r)$ distributed along the radius of the plasma 5 is calculated, according to the interference phase shift and the optical rotation, by Formula (11) as follows:

$$B_a(r) = \frac{1.7\alpha(r)}{\lambda\delta(r)} \quad (11)$$

where $B_a(r)$ is the average magnetic field intensity distributed along the radius of the plasma 5, α(r) is the rotation angle of the plasma 5 at different radii, and δ(r) is the interference phase shift of the plasma 5 at different radii.

The specific operation method of the optical measuring device for a plasma magnetic field with adjustable sensitivity is as follows:

The pulsed laser 1 is turned on, and the shadow, optical rotation and interference images without the plasma 5 are measured as a control. A pulse current is applied to a load, and simultaneously the pulsed laser 1, the first camera 14, the second camera 15, the third camera 16 and the fourth camera 17 are triggered, so as to measure the optical rotation image and the interference image of the plasma 5 in the discharge process; the trigger time is constantly adjusted, so as to obtain images at different times after the pulse current starts; the optical rotation image and interference image are processed to obtain the distributions of optical rotation angles and electron areal densities, so as to obtain the change of the distribution of magnetic induction intensities with time. The splitting ratio of the third beam splitter 7 and the fourth beam splitter 8 and the angle settings of the first polarization analyzer 12 and the second polarization analyzer 13 are adjusted in the optical rotation diagnosis device, so as to change the sensitivity of the measurement process.

What is claimed is:

1. An optical measuring device for a plasma magnetic field with adjustable sensitivity, comprising a pulsed laser (1), a pulsed laser beam (2), a polarizer (3), a first beam splitter (4), a plasma (5), a second beam splitter (6), a third beam splitter (7), a fourth beam splitter (8), a first mirror (9), a second mirror (10), a fifth beam splitter (11), a first polarization analyzer (12), a second polarization analyzer (13), a first camera (14), a second camera (15), a third camera (16) and a fourth camera (17);

wherein the pulsed laser (1) is configured as a light source to emit the pulsed laser beam (2), the pulsed laser beam (2) emitted by the pulsed laser (1) passes through the plasma (5) via the polarizer (3) and enters the third beam splitter (7) for beam splitting, the pulsed laser beam (2) reflected by the third beam splitter (7) passes through the first polarization analyzer (12) and enters the second camera (15), the pulsed laser beam (2) transmitted by the third beam splitter (7) enters the fourth beam splitter (8) for beam splitting, the pulsed laser beam (2) reflected by the fourth beam splitter (8) passes through the second polarization analyzer (13) and enters the third camera (16), and the pulsed laser beam (2) transmitted by the fourth beam splitter (8) enters the fourth camera (17) via the first mirror (9); and wherein the pulsed laser beam (2) emitted by the pulsed laser (1) passes through the first beam splitter (4) via the polarizer (3) for beam splitting, the pulsed laser beam (2) transmitted by the first beam splitter (4) passes through the plasma (5) and the second beam splitter (6) in turn, the pulsed laser beam (2) reflected by the second beam splitter (6) enters the fifth beam splitter (11), the pulsed laser beam (2) reflected by the first beam splitter (4) passes through the second mirror (10) and enters the fifth beam splitter (11), and two beams entering the fifth beam splitter (11) enter the first camera (14) together.

2. The optical measuring device for the plasma magnetic field with adjustable sensitivity according to claim 1, further comprising a vacuum cavity (18), wherein the plasma (5) is provided in the vacuum cavity (18).

3. The optical measuring device for the plasma magnetic field with adjustable sensitivity according to claim 1, wherein the centers of the first beam splitter (4), the second beam splitter (6), the third beam splitter (7) and the fourth beam splitter (8) are at a same height.

4. The optical measuring device for the plasma magnetic field with adjustable sensitivity according to claim 1, wherein the polarizer (3), the first polarization analyzer (12) and the second polarization analyzer (13) are polarizers with an extinction ratio greater than 100,000:1.

5. The optical measuring device for the plasma magnetic field with adjustable sensitivity according to claim 1, wherein the first camera (14), the second camera (15), the third camera (16) and the fourth camera (17) have a linearity of 1.

6. The optical measuring device for the plasma magnetic field with adjustable sensitivity according to claim 1, wherein the first polarization analyzer (12) and the second polarization analyzer (13) have polarization directions with a same polarization angle, but opposite in directions, with respect to the polarizer (3).

7. An optical measurement method for the plasma magnetic field with adjustable sensitivity according to claim 1, comprising the following steps:
- constructing an optical rotation measuring system based on a pulsed laser beam to measure an optical rotation image and a shadow image;
- processing the optical rotation image and the shadow image, and obtaining a distribution of proportional coefficients based on a light intensity distribution;
- obtaining a distribution of rotation angles by combining a mapping relationship between the proportional coefficients and the rotation angles;
- constructing an interference measurement system based on the pulsed laser beam, and measuring a phase shift of an interference image;
- calculating a distribution of electron areal densities based on the phase shift in the interference image; and
- obtaining a two-dimensional distribution of an average magnetic field based on the rotation angles and the electron areal densities.

8. The optical measurement method for the plasma magnetic field with adjustable sensitivity according to claim 7, wherein said constructing the optical rotation measuring system based on the pulsed laser beam to measure the optical rotation image and the shadow image comprises the following steps:
- emitting the pulsed laser beam (2) by the pulsed laser (1), after the pulsed laser beam (2) passes through the polarizer (3) in a p polarization direction to become linearly polarized light, without passing through the plasma (5), the pulsed laser beam (2) entering the third beam splitter (7), the fourth beam splitter (8) and the first mirror (9) in turn, capturing a picture $I_1$ of the pulsed laser beam (2) reflected by the third beam splitter (7) through the first polarization analyzer (12) by the second camera (15), capturing a picture of $I_2$ the pulsed laser beam (2) reflected by the fourth beam splitter (8) through the second polarization analyzer (13) by the third camera (16), and capturing a picture $I_3$ of the pulsed laser beam (2) reflected by the first mirror (9) by the fourth camera (17);
- wherein emitting the pulsed laser beam (2) by the pulsed laser (1), after the pulsed laser beam (2) passes through the polarizer (3) in the p polarization direction to become linearly polarized light, and passes through the plasma (5), the pulsed laser beam (2) entering the third beam splitter (7), the fourth beam splitter (8) and the first mirror (9) in turn, capturing a picture $I'_1$ of the pulsed laser beam (2) reflected by the third beam splitter (7) through the first polarization analyzer (12) by the second camera (15), capturing a picture $I'_2$ of the pulsed laser beam (2) reflected by the fourth beam splitter (8) through the second polarization analyzer (13) by the third camera (16), and capturing a picture $I'_3$ of the pulsed laser beam (2) reflected by the first mirror (9) by the fourth camera (17);
- said processing the optical rotation image and the shadow image, and obtaining the distribution of proportional coefficients based on the light intensity distribution comprises the following steps:
- denoting a fixed angle of a polarization plane of the first polarization analyzer (12) relative to incident light as $+\beta$, a fixed angle of a polarization plane of the second polarization analyzer (13) relative to the incident light as $-\beta$, an energy distribution of the pulsed laser beam as $I(x,y)$, and an intensity of the optical rotation image $I_1$ captured by the second camera (15) as $I_1(x,y)$, and expressing $I_1(x,y)$ by Formula (1) as follows:

$$I_1(x,y) = D_1(0) I(x,y) \cos^2(\beta) \quad (1)$$

denoting an intensity of the optical rotation image $I_2$ captured by the third camera (16) as $I_2(x,y)$, and expressing $I_2(x,y)$ by Formula (2) as follows:

$$I_2(x,y) = D_2(0) I(x,y) \cos^2(\beta) \quad (2)$$

denoting an intensity of the shadow image $I_3$ captured by the fourth camera (17) as $I_3(x,y)$, and expressing $I_3(x,y)$ by Formula (3) as follows:

$$I_3(x,y) = D_3(0) I(x,y) \quad (3)$$

where $D_1$, $D_2$ and $D_3$ represent the proportional coefficients of the imaging light intensities of the second camera (15), the third camera (16) and the fourth camera (17), relative to an incident light intensity in an imaging system, as functions of a polarization angle of the incident light;

wherein when the plasma (5) exists, it is assumed that an optical rotation value caused by the plasma (5) is $\alpha(x,y)$; when a transmission efficiency as well as a reflection efficiency of the third beam splitter (7) and the fourth beam splitter (8) for S polarized light and P polarized light are different from each other, polarization angles $\theta_1$ and $\theta_2$ of the reflected light of the third beam splitter (7) and the fourth beam splitter (8) are functions relative to $\alpha(x,y)$, and $\theta_1$ and $\theta_2$ are expressed by Formula (4) as follows:

$$\theta_1 = \cos^{-1}\left(\sqrt{\frac{\cos^2(\alpha) \Box P_r}{\cos^2(\alpha) \Box P_r + \sin^2(\alpha) \Box S_r}}\right) \quad (4)$$

$$\theta_2 = \cos^{-1}\left(\sqrt{\frac{\cos^2(\alpha) \Box P_t \Box P_r}{\cos^2(\alpha) \Box P_t \Box P_r + \sin^2(\alpha) \Box S_t \Box S_r}}\right)$$

where the S polarized light and the P polarized light are polarized light generated when the pulsed laser beam (2) passes through the polarizer (3), $P_r$ and $P_t$ represent the reflection and transmission efficiencies of the third beam splitter (7) and the fourth beam splitter (8) for the P polarized light, respectively, and $S_r$ and $S_t$ represent the reflection and transmission efficiencies of the third beam splitter (7) and the fourth beam splitter (8) for the S polarized light, respectively;

wherein the incident light is the light injected into the plasma (5) after the pulsed laser beam (2) passes through the polarizer;

considering an energy fluctuation of the pulsed laser (1), denoting an energy distribution of the pulsed laser beam as I'(x,y), and an intensity of the optical rotation image I'$_1$ captured by the second camera (15) as I'$_1$(x,y), and expressing I'$_1$(x,y) by Formula (5) as follows:

$$I'_1(x,y)=D_1(\alpha)I'(x,y)\cos^2(\theta_1(\alpha)-\beta) \quad (5)$$

denoting an intensity of the optical rotation image I'$_2$ captured by the third camera (16) as I'$_2$(x,y), and expressing I'$_2$(x,y) by Formula (6) as follows:

$$I'_2(x,y)=D_2(\alpha)I'(x,y)\cos^2(\theta_2(\alpha)+\beta) \quad (6)$$

denoting an intensity of the shadow image I'$_3$ captured by the fourth camera (17) as I'$_3$(x,y), and expressing I'$_3$(x,y) by Formula (7) as follows:

$$I'_3(x,y)=D_3(\alpha)I'(x,y) \quad (7)$$

and introducing a proportional index I$_F$ shown in Formula (8) as follows:

$$I_F(x,y) = \left(\frac{I'_1(x,y)}{I_1(x,y)} - \frac{I'_2(x,y)}{I_2(x,y)}\right) / \frac{I'_3(x,y)}{I_3(x,y)} \quad (8)$$

and said obtaining the distribution of rotation angles by combining the mapping relationship between the proportional coefficients and the rotation angles comprises:

when a value of $\beta$ is fixed, there being a mapping relationship between the proportional index I$_F$ and the optical rotation angle $\alpha$, and deducing reversely a value of the optical rotation angle $\alpha$ according to the value of the proportional index I$_F$.

9. The optical measurement method for the plasma magnetic field with adjustable sensitivity according to claim 8, wherein said constructing an interference measurement system based on the pulsed laser beam and measuring the phase shift of the interference image comprises:

the pulsed laser beam (2) emitted by the pulsed laser (1) passing through the first beam splitter (4) through the polarizer (3) for beam splitting, the pulsed laser beam (2) transmitted by the first beam splitter (4) passing through the plasma (5) and the second beam splitter (6) in turn to form load light; the pulsed laser beam (2) reflected by the first beam splitter (4) passing through the second mirror (10) to form reference light, the load light and the reference light entering the fifth beam splitter (11) to form interference stripes, capturing the interference stripes as interference images by the first camera (14), and calculating the phase shift $\delta(y)$ of the interference images by Formula (9) as follows:

$$\delta(y) = \frac{e^2\lambda}{4\pi c^2 m_e \varepsilon_0} \int n_e \cdot dl \quad (9)$$

where y represents a distance of the pulsed laser beam from an axis of the plasma, e represents an electron charge, $\lambda$ represents a wavelength of the pulsed laser beam, $\varepsilon_0$ represents a vacuum dielectric constant, $m_e$ represents an electron mass, c represents the speed of light, $n_e$ represents an electron density, and dl represents an element of an incident optical path; and said calculating the distribution of electron areal densities based on the phase shift in the interference image comprises:

measuring an areal electron density in the plasma by Formula (10) as follows:

$$\Delta\delta = 4.46 \cdot 10^{-14} \lambda \int_0^L n_e dl \quad (10)$$

where $\Delta\delta$ represents the phase shift, and L represents a length of a propagation path of the pulsed laser beam in the plasma.

10. The optical measurement method for the plasma magnetic field with adjustable sensitivity according to claim 9, wherein said obtaining the two-dimensional distribution of the average magnetic field based on the rotation angles and the electron areal densities comprises the following steps:

acquiring, by comparing the interference stripes of the load light passing through the plasma (5) with the interference stripes of the load light not passing through the plasma (5), a two-dimensional distribution of an interference phase shift, and obtaining an integral distribution of the areal electron density on a pulsed laser beam path based on the two-dimensional distribution of the interference phase shift; and calculating an average magnetic field intensity B$_a$(r) distributed along a radius of the plasma (5) according to the interference phase shift and the optical rotation by Formula (11) as follows:

$$B_a(r) = \frac{1.7\alpha(r)}{\lambda\delta(r)} \quad (11)$$

where B$_a$(r) represents the average magnetic field intensity distributed along the radius of the plasma (5), $\alpha$(r) represents a rotation angle of the plasma (5) at different radii, and $\delta$(r) represents an interference phase shift of the plasma (5) at different radii.

* * * * *